United States Patent [19]

Okuhara et al.

[11] 4,063,115

[45] Dec. 13, 1977

[54] SEMICONDUCTOR SWITCH

[75] Inventors: Shinzi Okuhara, Fujisawa; Yoshikazu Hosokawa, Hitachi; Tatsuya Kamei, Hitachi; Masayoshi Suzuki, Hitachi, all of Japan

[73] Assignee: Hitachi, Ltd., Japan

[21] Appl. No.: 720,492

[22] Filed: Sept. 3, 1976

[30] Foreign Application Priority Data

Sept. 10, 1975 Japan ............................... 50-108968

[51] Int. Cl.$^2$ .......................................... H03K 17/72
[52] U.S. Cl. .............................. 307/252 G; 307/252 J; 307/305
[58] Field of Search .......... 307/252 R, 252 A, 252 D, 307/252 G, 252 J, 252 N, 305; 323/225 C; 361/100

[56] References Cited

U.S. PATENT DOCUMENTS 3,549,905  12/1970  Johnson ........................ 307/252 J Primary Examiner—John Zazworsky
Attorney, Agent, or Firm—Craig & Antonelli

[57] ABSTRACT

A semiconductor switch assuring the easy formation of a semiconductor integrated circuit and having high control sensitivity while maintaining high $dv/dt$ - immunity, which comprises a PNPN switch of an equivalently four-layered structure including at least three PN-junctions, an anode and a cathode, switching means including a control terminal and connected with the PNPN switch to shunt one of the three PN-junctions at either one end of the PNPN switch, amplifying means, and a capacitive element for differentiating a voltage applied between the anode and the cathode of the PNPN switch to allow a current to flow into the control terminal of the switching means through the amplifying means, so that the switching means is driven by the current thereby to short-circuit the one of three PN-junctions.

7 Claims, 9 Drawing Figures

SEMICONDUCTOR SWITCH

The present invention relates to a semiconductor switch of an equivalently four-layered PNPN structure including at least three PN-junctions, the semiconductor switch being used as a switching element for control devices.

Generally, a PNPN switch called an SCR, thyristor or the like which has an equivalently four-layered PNPN structure and includes at least three PN-junctions (hereinafter referred to as PNPN switch) has the drawback that the PNPN switch is driven erroneously even during interruption when it receives a steeply rising forward voltage between its anode and cathode. This is called a rate effect, and a withstandingness against the rate effect is called $dv/dt$ - immunity.

Figure 1:
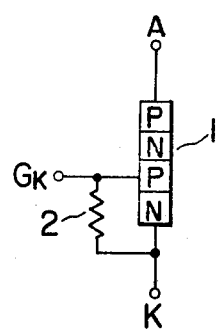
FIG. 1 is a circuit diagram showing a conventional semiconductor switch with a PNPN switch in which a method of protecting it from a transient voltage ($dv/dt$) is provided.
Figure 2:
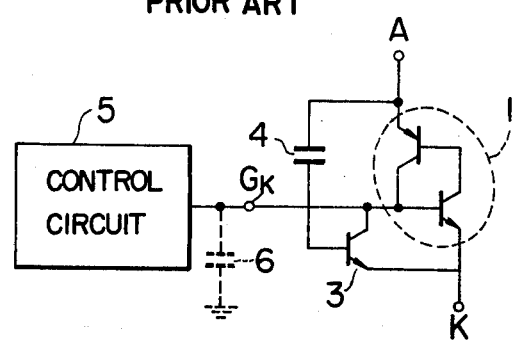
FIG. 2 is a circuit diagram showing a conventional semiconductor switch with a PNPN switch which is most similar to that according to the present invention.

In order to prevent erroneous firing of a PNPN switch, there is usually employed a method as shown in FIG. 1 in which a PNPN switch 1 is short-circuited between its gate GK and cathode K by means of a resistor 2. The resistor 2 must be low resistance to achieve the high $dv/dt$ - immunity in the method of FIG. 1. This necessarily results in reduced gate sensitivity. FIG. 2, on the other hand, shows the prior art disclosed in U.S. Pat. No. 3,609,413 in which a transistor 3 is connected between the gate GK and cathode K of the PNPN switch 1 and a capacitor 4 is connected between the base of the transistor 3 and the anode A of the PNPN switch 1. The circuit as shown in FIG. 2 is intended to differentiate a transient voltage applied between the anode A and cathode K of the PNPN switch 1 by means of the capacitor 4 to drive the transistor 3 in an attempt to prevent the rate effect. The experiment carried out by the present inventors, however, shows that, in the method of FIG. 2, the capacitor 4 needs a capacitance of at least 5 PF for example when the PNPN switch receives a voltage causing its cathode potential to go down in the presence of a parasitic capacitance at a control circuit 5 connected to the gate GK of the PNPN switch 1. The circuit as shown in FIG. 2, therefore, has the drawback that the capacitor 4 is difficult to be made in the form of an integrated circuit when the whole circuit is desired to be manufactured in the form of the monolithic semiconductor integrated circuit. Further, in the circuit of FIG. 2, useless electric charges undesirably remain at the base of the transistor 3, resulting in little improvement in the $dv/dt$ - immunity when the circuit repeats the firing and interruption in a rapid cycle. It has further been found that the application of a small transient voltage ($dv/dt$) allows no sufficient operation of the transistor 3 with the result that the PNPN switch 1 still causes the erroneous firing.

An object of the present invention is to provide a semiconductor switch of a PNPN structure maintaining the high $dv/dt$ - immunity irrespective of the fluctuation of its anode or cathode potential.

Another object of the present invention is to provide a semiconductor switch of a PNPN structure having not only the high $dv/dt$ - immunity but also a high gate sensitivity.

Still another object of the present invention is to provide a semiconductor switch of a PNPN structure which is easily manufactured in the form of a monolithic semiconductor integrated circuit.

According to the invention, there is provided a semiconductor switch which comprises a PNPN switch of an equivalently four-layered structure including at least three PN-junctions, an anode and a cathode, switching means including a control terminal and connected with the PNPN switch to shunt one of the three PN-junctions at either one end of the PNPN switch, amplifying means, and a capacitive element for differentiating a voltage applied between the anode and the cathode of the PNPN switch to allow a current to flow into the control terminal of the switching means through the amplifying means, so that the switching means is driven by the current thereby to short-circuit the one of three PN-junctions.

Figure 3:
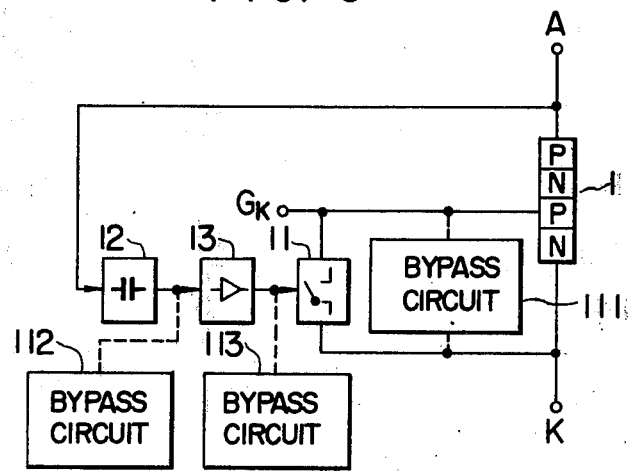
FIG. 3 is a block diagram showing a basic arrangement of a semiconductor switch according to the present invention.

FIG. 3 is a block diagram showing a basic arrangement of a semiconductor switch according to the present invention in which a PNPN switch 1 including an anode A, cathode K, and gate GK has one PN-junction (between the cathode K and gate GK, for example, in this embodiment) short-circuited by means of an electronic switch 11, which is driven by an amplifier 13 for amplifying a current flowing into a capacitive element 12 for deriving a transient voltage ($dv/dt$) applied across the anode A and cathode K. If necessary, bypass circuits 111, 112, 113 may be connected to the PNPN switch 1, electronic switch 11 and amplifier 13, respectively, as shown in FIG. 3 in order to provide a discharging path for the charges stored in those devices. Such an arrangement makes it possible to short-circuit the one PN-junction of the PNPN switch so satisfactorily that the rate effect appearing on the PNPN switch 1 can be prevented substantially completely even if a capacitive element of small electrostatic capacity is used.

Figure 4:
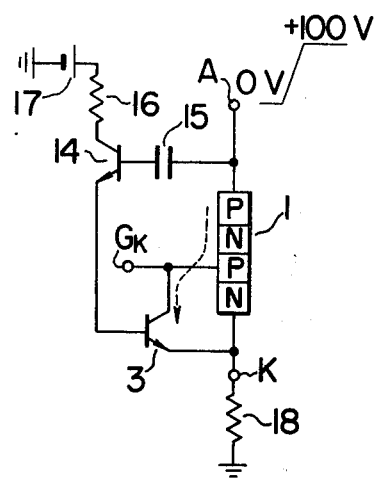
FIG. 4 is a circuit diagram showing the first embodiment of a semiconductor switch according to the present invention.

FIG. 4 shows the first embodiment of a semiconductor switch according to the present invention in which the PNPN switch 1 including three PN-junctions has its one PN-junction connected between the collector and emitter of a first transistor 3, which has its base connected to the emitter of a second transistor 14 with its base being connected to the anode A of the PNPN switch through a capacitor 15. The second transistor 14 has its collector connected to a power supply 17 through a resistor 16. It should be noted that a resistor 18 shows a load for the semiconductor switch of this circuit arrangement. In this arrangement of FIG. 4, the application of a rising voltage to the anode of the interrupted PNPN switch as shown in the figure causes this voltage to be applied to the capacitor 15 to produce a differentiated current, which flows into the base of the second transistor 14 and is amplified by the transistor 14 to drive the first transistor 3. As a result, charging junction current flowing through the central PN-junction of the PNPN switch 1 (its polarity relative to the applied voltage being in a backward bias, that is, blocking direction) flows into the first transistor 3 as shown by a dotted line in the figure to generate the high $dv/dt$ - immunity as if one PN-junction of the PNPN switch were short-circuited by a low resistance. It is, therefore, possible to reduce the capacitance of the capacitor 15 to a value no more than one-fifth or one-sixth times as much as the capacitance of at least 5 PF for example which is required in the absence of the transistor 14 in view of the fact that the first transistor 3 is driven in response to the current amplified by the second transistor 14. This allows the area in the formation of the integrated circuit to be reduced to one-fifth or one-sixth, thus assuring the easy formation of the integrated circuit.

Figure 5:
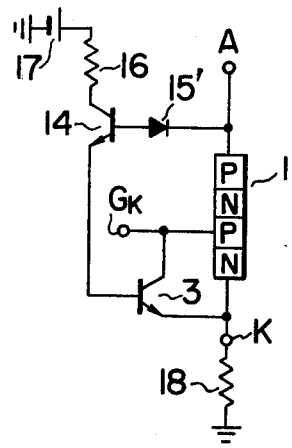
FIG. 5 is a circuit diagram showing a modified example of the circuit shown in FIG. 4.

FIG. 5 shows a modification of the semiconductor switch of the present invention as shown in FIG. 4. In this embodiment, the capacitor 15 in the embodiment shown in FIG. 4 is replaced by a small-sized diode 15' to use its junction capacitance due to the above-mentioned reason.

Figure 6:
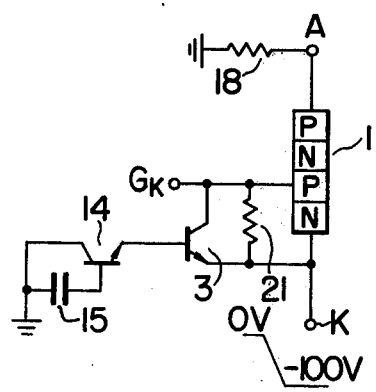
FIGS. 6 to 9 are, respectively, a circuit diagram showing second to fifth embodiments of a semiconductor switch according to the present invention.

FIG. 6 shows the second embodiment of a semiconductor switch according to the present invention in which the first transistor 3 and a resistor 21 are connected in parallel between the gate GK and cathode K of the PNPN switch 1 and the first transistor 3 has its base connected to the emitter of the second transistor 14 whose collector is grounded and whose base is grounded through the capacitor 15. The resistor 18 provided at the anode of the PNPN switch 1 represents a load for the semiconductor switch of this circuit arrangement, and the PNPN switch receives at its cathode K a negative-going voltage as shown in the figure. In this arrangement, the capacitor 15 comes into no direct coupling with the anode A of the PNPN switch, but, also in this case, the substantially similar feature according to the present invention can be achieved. In other words, the voltage applied to the cathode K of the PNPN switch 1 is also applied to the anode A of the PNPN switch 1 through the resistor 18 and substantially the same voltage is simultaneously applied to the capacitor 15 through the base-emitter junction of the first and second transistors 3, 14. The variation in potential of the cathode K, therefore, causes the generation of a differentiated current across the capacitor 15. The current is amplified by the second transistor 14 to drive the first transistor 3 with the high $dv/dt$ - immunity obtained as in the embodiment of FIG. 4. A resistor 21 serves to present the erroneous firing due to a small leakage current when the PNPN switch 1 is at high temperatures, or serves to protect the transistors 3, 14 stably against a very small transient voltage ($dv/dt$) at which they do not operate sufficiently. Therefore, the resistor 21 can be designed to be a high resistance, so that it does not cause any reduction of the gate-sensitivity of the PNPN switch but retains the high gate-sensitivity.

Figure 7:
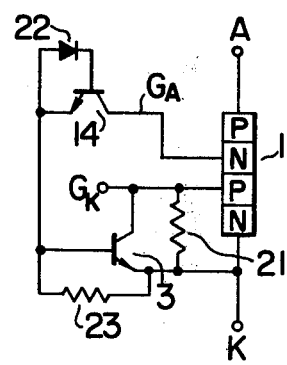

FIG. 7 shows the third embodiment of the semiconductor switch according to the present invention. In the two foregoing embodiments, the second transistor 14 is provided with an amplification function by means of another power supply, or connected to the ground, while in the embodiment of FIG. 7 the second transistor 14 has its collector connected to the anode gate region GA of the PNPN switch 1. A diode 22 is connected between the base and emitter of the second transistor 14, and a resistor 23 short-circuits the base-emitter path of the first transistor 3. Although, in this arrangement, the capacitor 15 shown in the embodiments of FIGS. 4 and 6 are not employed, the junction capacitance derived from the base-collector junction of the second transistor 14 actually serves as capacitor to provide the sufficient effect also in this arrangement. In other words, the application of a voltage between the anode A and cathode K of the PNPN switch 1 in the circuit of FIG. 7 causes the voltage to be applied to the collector of the second transistor 14 through the first junction (in a forward direction) of the PNPN switch 1 to amplify a current serving to charge the base-collector junction of the second transistor 14 with the aid of the transistor 14 itself and to drive the first transistor 3. The collector of the transistor 14 is also connected to the anode A of the PNPN switch 1 with the similar effect obtained. In this case, however, a current flows from the cathode K to anode A through the emitter-base of the first and second transistors when the cathode K is higher in potential than the anode A (when the PNPN switch 1 receives a backward voltage). This causes the loss of the feature that the PNPN switch has the high breakdown voltage in forward and backward directions, so that the transistor 14 has its collector connected to the anode-gate region GA of the PNPN switch in an attempt to prevent the inverse flow of the current. On the other hand, the firing of the PNPN switch 1 with the cathode gate controlled after the application of a voltage between the anode A and cathode K thereof causes the discharge of electric charges which have been stored in the collector-base junction of the second transistor 14 till now. In the circuit shown in FIG. 7, the diode 22 and the resistor 23 are provided to form this discharging path. Otherwise, the discharge current flows, breaking down the emitter-base junction of the first and second transistors 3, 14 (the breakdown voltage at the emitter-base junction being usually several voltages). This causes negative electric charges to remain at the base of the first and second transistors at the time of switching in a short repeating cycle with the result that the $dv/dt$ - immunity is liable to degrade. The diode 22 and resistor 23 are, therefore, suitable for use with a semiconductor switch used as high-speed switch. It is to be noted that the resistor 21 has the same function as that described in the second embodiment as mentioned above.

Figure 8:
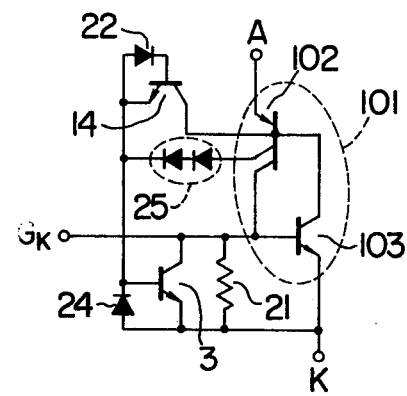

FIG. 8 is a circuit diagram showing the fourth embodiment of the semiconductor switch of the present invention. A PNPN switch 101 of FIG. 8 is a composite circuit comprising a PNP transistor 102 including two collectors and an NPN transistor 103, and is a circuit well-known as an equivalent circuit of a common PNPN switch with the exception that the PNP transistor 102 has another collector. The emitter-base junction of the first transistor 3 is provided with a diode 24 in substitution for the resistor 23, and the new collector provided at the PNP transistor 102 is connected to the base of the first transistor 3 through a level shifting diode 25. This arrangement causes the multiplicative supply of the current flowing out of the new collector of the PNP transistor 102 to the base of the first transistor 3 and allows the improvement in $dv/dt$ - immunity when a voltage is applied between the anode A and cathode K of the PNPN switch 101. The firing of the PNPN switch 101 during interruption causes the base potential of the first transistor 3 to be restored to the forward bias rapidly due to the function of the new collector in the PNP transistor 102 with a great effect for use as a high-speed switch. The reason is that the base potential of the first transistor 3 is about 0.7 V lower than its emitter (inversely biased) due to the discharge of electric charges stored in the base-collector junction of the second transistor 14 through the diodes 24 and 22 at the instant of the firing of the PNPN switch 101, but is able to be restored immediately to the forward potential in cooperation with the current supply from the new collector of the PNP transistor 102. It can, therefore, be said that the new collector provided at the PNP transistor 102 and the level shifting diode 25 are a kind of discharging bypass circuit similarly as the diodes 22, 24 although they are diferent in structure from each other.

Figure 9:
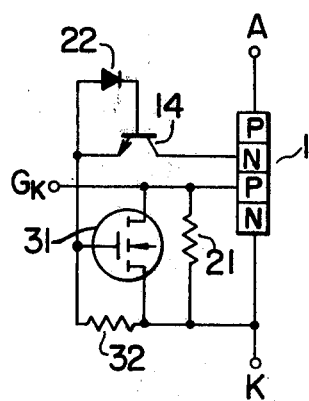

FIG. 9 is the fifth embodiment of the semiconductor switch according to the present invention, in which the first transistor is constructed of a field effect transistor (hereinafter referred to as FET). The PNPN switch has its one junction connected to the resistor 21 and an N-channel enhancement mode FET 31, whose gate is coupled to the emitter of the second transistor 14, and also to a resistor 32. This arrangement causes the differentiated current amplified by the second transistor to provide the resistor 32 with a voltage drop to make the FET 31 conductive.

In the embodiments described in FIGS. 3 to 7 and 9, the PNPN switch 1 has been described as being of a longitudinally laminated structure, but may be a lateral thyristor (or planar thyristor in which the PNP transistor portion is laterally arranged as is used in the integrated circuit. The electronic switch can be realized by a transistor commonly used, FET, or the like as in the above-mentioned embodiment, but is not limited to the present embodiment. The capacitive element can be realized by a capacitor, diode, junction capacitance of a transistor, or in any combination thereof. The amplifier can be formed of a transistor, FET, vacuum tube or the like not only as a simple one-stage amplifier but as multi-stage amplifier to enhance an amplification factor. Further, the power supply for the amplifier can be separately provided as shown in FIGS. 4 and 5, or can be realized using the voltage applied to the PNPN switch as shown in FIGS. 6 to 9. The circuit in the above-mentioned embodiment can also be realized by its complementary circuit in which current is caused to flow in an inverse direction, these combinations being arbitrary. The discharging bypass circuit is provided as required.

As described above, the present invention provides the semiconductor switch comprising the PNPN switch with the high dv/dt - immunity and high sensitivity, suitably adapted for use in the formation of the semiconductor integrated circuit.

What is claimed is:

1. A semiconductor switch comprising: a PNPN switch of an equivalently four-layered PNPN structure including at least three PN-junctions, an anode and a cathode; switching means including a control terminal and connected with said PNPN switch to shunt one of said three PN-junctions at either one end of said PNPN switch; amplifying means; and a capacitive element for differentiating a voltage applied between the anode and the cathode of said PNPN switch to allow a current to flow into the control terminal of said switching means through said amplifying means, so that said switching means is driven by said current thereby to short-circuit said one of three PN-junctions.

2. A semiconductor switch comprising: a PNPN switch of an equivalently four-layered PNPN structure including three PN-junctions, an anode, a cathode gate, and a cathode; a first transistor; a second transistor; a capacitive element; a resistor; and a power supply, said first transistor having its collector and emitter connected between the cathode gate and the cathode of said PNPN switch and its base connected to the emitter of the second transistor, and said second transistor having its base connected to the anode of said PNPN switch through the capacitive element and its collector grounded through a series connection of said resistor and power supply.

3. A semiconductor switch according to claim 2, wherein a PN-junction of a diode is used as said capacitive element.

4. A semiconductor switch comprising: a PNPN switch of an equivalently four-layered PNPN structure including three PN-junctions, a cathode gate, and a cathode; a first transistor; a second transistor; a resistor; and a capacitive element, said resistor being connected between the collector and emitter of said first transistor, said first transistor having its collector and emitter connected to the cathode gate and the cathode of the PNPN switch, respectively, and its base connected to the emitter of said second transistor, said second transistor having its collector grounded and its base grounded through said capacitive element.

5. A semiconductor switch comprising: a PNPN switch of an equivalently four-layered PNPN structure including three PN-junctions, an anode gate, a cathode gate, and a cathode; a first transistor; a second transistor; a diode; and two resistors; one of said resistor being connected between the collector and emitter of said first transistor, said first transistor having its collector and emitter connected to the cathode gate and cathode of the PNPN switch, respectively, and its base connected to the emitter of said second transistor and to its emitter through the other resistor, said second transistor having its collector connected to the anode gate of the PNPN switch and its base connected to its emitter through said diode.

6. A semiconductor switch comprising: a PNPN switch of an equivalently four-layered PNPN structure including an anode gate, a cathode gate, a cathode, and four PN-junctions with its anode gate region additionally provided with a P-collector region; a first transistor; a second transistor; two diodes; a resistor; and a level shifting diode, said resistor being connected between the collector and emitter of said first transistor, said first transistor having its collector and emitter connected to the cathode gate and cathode of the PNPN switch, respectively, and its base connected to the emitter of the second transistor and the one end of the level shifting diode with the base of the first transistor being connected to the emitter thereof through one of said two diodes, said second transistor having its collector connected to the anode gate of the PNPN switch and its base connected to its emitter through the other diode, the other end of the level shifting diode being connected to the P-collector region additionally provided at the anode gate of said PNPN switch.

7. A semiconductor switch comprising: a PNPN switch of an equivalently four-layered PNPN structure including three PN-junctions, an anode, an anode gate, a cathode gate, and a cathode; a field effect transistor; a transistor; a diode; and two resistors, said field effect transistor having its drain and source connected to the cathode gate and the cathode of said PNPN switch and its gate connected to the emitter of said transistor, one of said two resistors being connected between the drain and the source of said field effect transistor, the other resistor being connected between the gate and the source of said field effect transistor, said transistor having its collector connected to the anode gate of said PNPN switch, said diode being connected between the base and the emitter of said transistor.

* * * * *